US012538724B2

(12) United States Patent
Fu

(10) Patent No.: US 12,538,724 B2
(45) Date of Patent: Jan. 27, 2026

(54) METHOD FOR IMPROVING PLASMA DISTRIBUTION IN ETCHING

(71) Applicant: Shanghai Huali Integrated Circuit Corporation, Shanghai (CN)

(72) Inventor: Wentao Fu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 627 days.

(21) Appl. No.: 17/888,615

(22) Filed: Aug. 16, 2022

(65) Prior Publication Data

US 2023/0162986 A1 May 25, 2023

(30) Foreign Application Priority Data

Nov. 24, 2021 (CN) ........................ 202111399239.7

(51) Int. Cl.
*H01L 21/3065* (2006.01)
*H01J 37/32* (2006.01)

(52) U.S. Cl.
CPC ........ *H01L 21/3065* (2013.01); *H01J 37/321* (2013.01); *H01J 37/3211* (2013.01); *H01J 37/3266* (2013.01); *H01J 2237/334* (2013.01)

(58) Field of Classification Search
None
See application file for complete search history.

(56) References Cited

U.S. PATENT DOCUMENTS 5,440,206 A * 8/1995 Kurono ............ H01J 37/32623 315/111.41
2011/0094994 A1* 4/2011 Todorow .............. C23C 16/505 216/68
2011/0284167 A1* 11/2011 Nishio ............... H01J 37/3266 156/345.35

FOREIGN PATENT DOCUMENTS

CN 113133175 A * 7/2021 ............... H05H 1/46
WO WO-2020210240 A1 * 10/2020 ........... H01J 37/321

* cited by examiner

*Primary Examiner* — Joshua L Allen
*Assistant Examiner* — Andrew Keelan Laobak
(74) *Attorney, Agent, or Firm* — Banner & Witcoff, Ltd.

(57) ABSTRACT

The present application provides a method for improving plasma distribution in etching, the RF coil is a circular coil composed of four arcs, and the four arcs are sequentially defined as first to fourth arcs; providing a cross support, wherein heads and tails of the first to fourth arcs are separately connected to the cross support; respectively applying different currents to the first to fourth arcs, which are sequentially first to fourth currents, so that different magnetic fields are formed respectively in areas enclosed by the first to fourth arcs and the cross support connected thereto, wherein the magnetic fields corresponding to the first to fourth currents are sequentially first to fourth magnetic fields; and adjusting the magnitudes of the first to fourth currents to change the first to fourth magnetic fields, thereby changing plasma distribution in the different areas.

6 Claims, 1 Drawing Sheet

METHOD FOR IMPROVING PLASMA DISTRIBUTION IN ETCHING

CROSS-REFERENCES TO RELATED APPLICATIONS

This application claims priority to Chinese Patent Application No. 202111399239.7, filed on Nov. 24, 2021, the disclosure of which is incorporated herein by reference in its entirety.

TECHNICAL FIELD

The present application relates to the technical field of semiconductors, in particular to a method for improving plasma distribution in etching.

BACKGROUND

During an etching process of chip manufacturing, etch uniformity is critical to the stability of a product yield. In order to improve the etch uniformity, a symmetrical structure is generally adopted in the design of a cavity. However, it is still impossible to achieve absolute symmetry, thus causing partially uneven plasma distribution. RF coils of the existing etching cavity are all complete concentric circles, and the distribution of induced magnetic fields is changed by adjusting a current flowing through the coil, so as to adjust the plasma distribution. There are some limitations on such the adjustment manner, which can achieve only the adjustment in a concentric circle mode but cannot achieve a partial area adjustment function.

Therefore, it is necessary to propose a new method to solve the above problem.

BRIEF SUMMARY

In view of the above defect in the prior art, the objective of the present application is to provide a method for improving plasma distribution in etching, so as to solve the problem in the prior art that plasma distribution in a partial area cannot be adjusted by means of a current of an RF coil.

In order to achieve the above objective and other related objectives, the present application provides a method for improving plasma distribution in etching, at least including:

step 1, providing an RF coil in a plasma etching cavity, wherein the RF coil is a circular coil composed of four arcs, and the four arcs are sequentially defined as first to fourth arcs;

step 2, providing a cross support, wherein heads and tails of the first to fourth arcs are separately connected to the cross support;

step 3, respectively applying different currents to the first to fourth arcs, which are sequentially first to fourth currents, so that different magnetic fields are formed respectively in areas enclosed by the first to fourth arcs and the cross support connected thereto, wherein the magnetic fields corresponding to the first to fourth currents are sequentially first to fourth magnetic fields; and step 4, adjusting the magnitudes of the first to fourth currents to change the first to fourth magnetic fields, thereby changing plasma distribution in the different areas.

In some examples, in step 4, the first current is increased while the third current is decreased, so as to change the first magnetic field and the third magnetic field.

In some examples, a method of adjusting the magnitudes of the first to fourth currents in step 4 is changing the magnitudes of the first to fourth currents in a proportional manner.

In some examples, the directions of the first to fourth currents in step 3 are the same.

In some examples, the directions of the first to fourth currents in step 3 are clockwise.

In some examples, the directions of the first to fourth currents in step 3 are counterclockwise.

As stated above, the method for improving plasma distribution in etching of the preset application has the following beneficial effects: the method of the preset application can achieve a function of adjusting partial plasma concentration in the etching cavity, and can effectively improve etch uniformity, expand a process window, and improve a product yield.

DETAILED DESCRIPTION OF THE DISCLOSURE

The embodiments of the present application are described below using specific examples, and those skilled in the art can easily understand other advantages and effects of the present application from the contents disclosed in the Description. The present application can also be implemented or applied using other different specific embodiments, and various details in the Description can also be modified or changed based on different viewpoints and applications without departing from the spirit of the present application.

Figure 1:
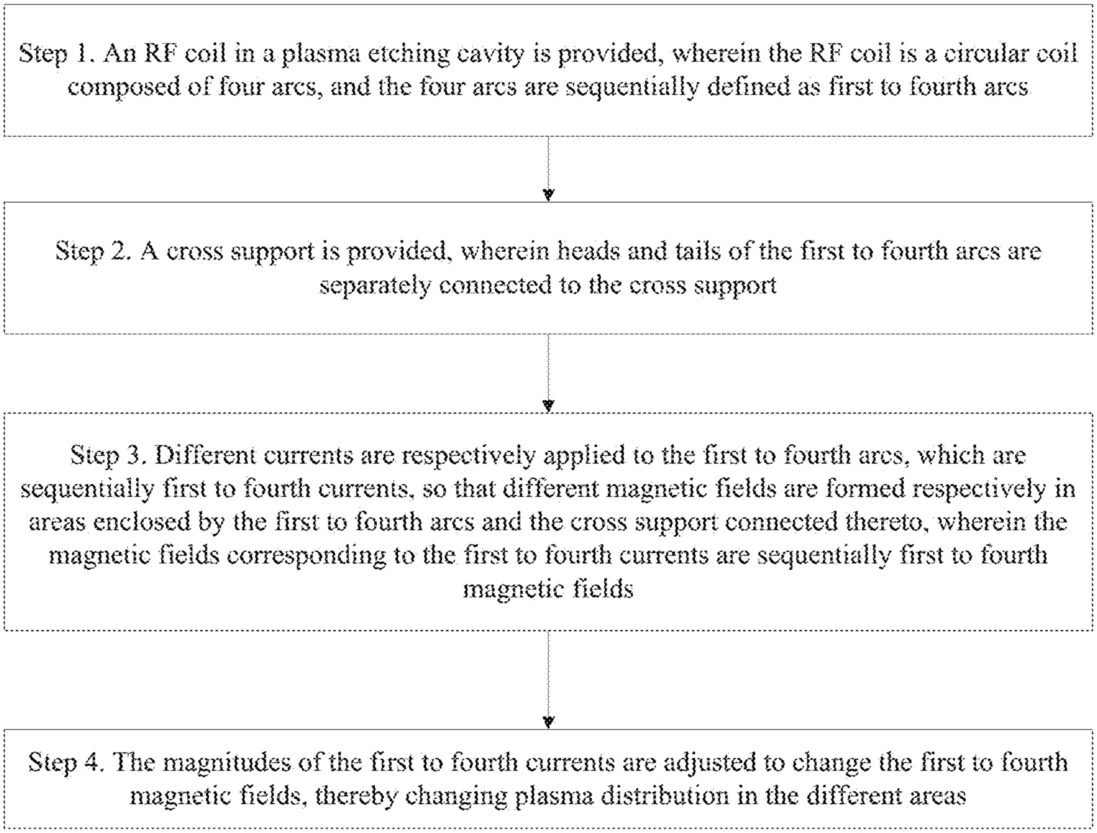
FIG. 1 is a flowchart of a method for improving plasma distribution in etching in the preset application.
Figure 2:
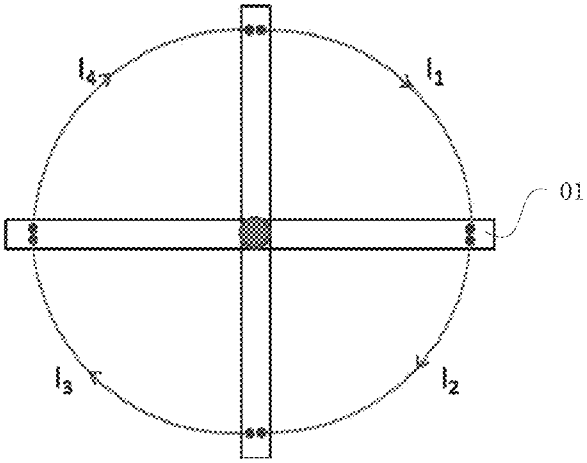
FIG. 2 is a schematic structural diagram of an RF coil composed of arcs in the preset application.

Please refer to FIGS. 1 and 2. It should be noted that the drawings provided in this embodiment are only used to illustrate the basic concept of the present application in a schematic way, so the drawings only show the components related to the present application rather than being drawn according to the number, shape, and size of the components in actual implementation. The type, number, and proportion of various components can be changed randomly during actual implementation, and the layout of components may be more complicated.

The present application provides a method for improving plasma distribution in etching. Referring to FIG. 1, FIG. 1 is a flowchart of the method for improving plasma distribution in etching in the preset application. The method at least includes the following steps.

Step 1. An RF coil in a plasma etching cavity is provided, wherein the RF coil is a circular coil composed of four arcs, and the four arcs are sequentially defined as first to fourth arcs. In this embodiment, the lengths of the first to fourth arcs are equal, and the first to fourth arcs are each a quarter of the RF coil (circular coil).

Step 2. A cross support is provided, wherein heads and tails of the first to fourth arcs are separately connected to the cross support. Referring to FIG. 2, FIG. 2 is a schematic structural diagram of the RF coil composed of the arcs in the preset application. The ends of the cross support 01 in FIG. 2 are respectively connected to end points of the first to fourth arcs.

Step 3. Different currents are respectively applied to the first to fourth arcs, which are sequentially first to fourth currents, so that different magnetic fields are formed respectively in areas enclosed by the first to fourth arcs and the cross support connected thereto, wherein the magnetic fields corresponding to the first to fourth currents are sequentially first to fourth magnetic fields. Referring to FIG. 2, in step 3, a current corresponding to the first arc is the first current I1, a current corresponding to the second arc is the second current I2, a current corresponding to the third arc is the third current I3, and a current corresponding to the fourth arc is the fourth current I4. A magnetic field in an area enclosed by the first arc and the cross support is the first magnetic field B1; a magnetic field in an area enclosed by the second arc and the cross support is the second magnetic field B2; a magnetic field in an area enclosed by the third arc and the cross support is the third magnetic field B3; and a magnetic field in an area enclosed by the fourth arc and the cross support is the fourth magnetic field B4.

In this embodiment of the present application, the directions of the first to fourth currents in step 3 are the same.

Referring to FIG. 2, in this embodiment of the present application, the directions of the first to fourth currents in step 3 are clockwise.

In other embodiments of the present application, the directions of the first to fourth currents in step 3 may be all counterclockwise.

Step 4. The magnitudes of the first to fourth currents are adjusted to change the first to fourth magnetic fields, thereby changing plasma distribution in the different areas.

In this embodiment of the present application, in step 4, the first current is increased while the third current is decreased, so as to change the first magnetic field and the third magnetic field.

In this embodiment of the present application, a method of adjusting the magnitudes of the first to fourth currents in step 4 is changing the magnitudes of the first to fourth currents in a proportional manner. That is, all the magnitudes of the first to fourth currents are increased or decreased by the same proportion.

By adjusting the magnitudes or proportions of the first to fourth currents, the magnitudes or proportions of the magnetic fields corresponding to the first to fourth currents can be adjusted, thereby changing the distribution of the magnetic fields in all the areas.

To sum up, the method of the preset application can achieve a function of adjusting partial plasma concentration in the etching cavity, and can effectively improve etch uniformity, expand a process window, and improve a product yield. Therefore, the present application effectively overcomes various defects in the prior art and has high industrial utilization value.

The above embodiment merely illustrates the principle and effect of the present application, rather than limiting the present application. Anyone skilled in the art can modify or change the above embodiment without departing from the spirit and scope of the present application. Therefore, all equivalent modifications or changes made by those with ordinary knowledge in the art without departing from the spirit and technical idea disclosed in the present application shall still be covered by the claims of the present application.

What is claimed is:

1. A method for improving plasma distribution in etching, at least comprising:

step 1, providing an RF coil in a plasma etching cavity, wherein the RF coil is a circular coil composed of four arcs, and the four arcs are sequentially defined as first to fourth arcs, wherein the four arcs do not overlap;

step 2, providing a cross support, wherein heads and tails of the first to fourth arcs are separately connected to the cross support;

step 3, respectively applying different currents to the first to fourth arcs, which are sequentially first to fourth currents, so that different magnetic fields are formed respectively in areas enclosed by the first to fourth arcs and the cross support connected thereto, wherein the magnetic fields corresponding to the first to fourth currents are sequentially first to fourth magnetic fields; and step 4, adjusting magnitudes of the first to fourth currents to change the first to fourth magnetic fields, thereby changing plasma distribution in the areas.

2. The method for improving plasma distribution in etching according to claim 1, wherein in step 4, the first current is increased while the third current is decreased, so as to change the first magnetic field and the third magnetic field.

3. The method for improving plasma distribution in etching according to claim 1, wherein the adjusting the magnitudes of the first to fourth currents comprises changing the magnitudes of the first to fourth currents in a proportional manner.

4. The method for improving plasma distribution in etching according to claim 1, wherein directions of the first to fourth currents in step 3 are the same.

5. The method for improving plasma distribution in etching according to claim 4, wherein the directions of the first to fourth currents in step 3 are clockwise.

6. The method for improving plasma distribution in etching according to claim 4, wherein the directions of the first to fourth currents in step 3 are counterclockwise.

* * * * *